US007979684B2

(12) United States Patent
Lin et al.

(10) Patent No.: US 7,979,684 B2
(45) Date of Patent: Jul. 12, 2011

(54) METHOD AND CONTEXT SWITCH DEVICE FOR IMPLEMENTING DESIGN-FOR-TESTABILITY FUNCTIONALITY OF LATCH-BASED REGISTER FILES

(75) Inventors: Jentsung Lin, Cardiff by the Sea, CA (US); Eai-Hsin Alfred Kuo, San Diego, CA (US); De Dzwo Hsu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 171 days.

(21) Appl. No.: 11/500,767

(22) Filed: Aug. 7, 2006

(65) Prior Publication Data

US 2008/0034192 A1    Feb. 7, 2008

(51) Int. Cl.
*G06F 9/00* (2006.01)
(52) U.S. Cl. ........................................................ 712/228
(58) Field of Classification Search .................. 712/228
See application file for complete search history.

(56) References Cited

U.S. PATENT DOCUMENTS

| | | |
|---|---|---|
| 5,280,616 A | 1/1994 | Butler et al. |
| 6,081,849 A * | 6/2000 | Born et al. ........................ 710/7 |
| 6,298,431 B1 | 10/2001 | Gottlieb |
| 6,691,268 B1 * | 2/2004 | Chin .............................. 714/726 |
| 2007/0136564 A1 * | 6/2007 | Menon et al. .................. 712/228 |

FOREIGN PATENT DOCUMENTS

WO    0233570    4/2002

OTHER PUBLICATIONS

Mano, M. Morris, Digital Design, Prentice-Hall, Inc. 1984, pp. 211-214.*
A Dictionary of Computing, Fifth Edition, Oxford University Press, 2004, p. 318.*
International Search Report—PCT/US07/075048, International Searching Authority—European Patent Office, Jun. 2, 2008.
Written Opinion—PCT/US07/075048, International Searching Authority—European Patent Office, Jun. 2, 2008.
International Preliminary Report on Patentability—PCT/US07/075048, IPEA—European Patent Office, Nov. 14, 2008.

* cited by examiner

*Primary Examiner* — Richard Ellis
(74) *Attorney, Agent, or Firm* — Peter Kamarchik; Nicholas J. Pauley; Sam Talpalatsky

(57) ABSTRACT

A method of changing execution contexts is provided that includes receiving a context selection input. In a first clock phase, the method includes shifting data from a first latch element of a normal execution context to a second latch element of the normal execution context and shifting shadow data from a third latch element of a shadow execution context to a fourth latch element of the shadow execution context. In a second clock phase, the method includes shifting the shadow data of the fourth latch element of the shadow execution context into the first latch element of the normal execution context and shifting the data of the second latch element of the normal execution context into the third latch element of the shadow execution context. In a particular embodiment, the method may include receiving a test mode selection and shifting test data, such as scan test or automatic test pattern generated data, to a test output.

13 Claims, 6 Drawing Sheets

METHOD AND CONTEXT SWITCH DEVICE FOR IMPLEMENTING DESIGN-FOR-TESTABILITY FUNCTIONALITY OF LATCH-BASED REGISTER FILES

BACKGROUND

I. Field of the Disclosure

The present disclosure generally relates to context switch, such as methods of switching among normal, shadow and test contexts.

II. Description of the Related Art

Advances in technology have resulted in smaller and more powerful personal computing devices. For example, a variety of portable personal computing devices, including wireless computing devices, such as portable wireless telephones, personal digital assistants (PDAs), and paging devices are small, lightweight, and easily carried by users. More specifically, portable wireless telephones, such as cellular (analog and digital) telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can include a web interface that can be used to access the Internet. As such, these wireless telephones include significant computing capabilities.

To provide multiple functions, such portable personal computing devices often include a multi-processing system, such as a multi-threaded processor (e.g. a processor capable of handling more than one program or process at a time. In a multi-threaded processing system, the operating system shares the processor among various threads (processes). Threads (processes) are constructed by the operating system. This sharing is typically implementing by switching between processes, where each process represents a context.

In general, a multi-threaded processing system generally has a register file that may include an array of register cells. Each register cell typically includes an output multiplexer to select between contexts (processes), which may be provided to a multiplexer for the array of register cells to select, for example, among sets/rows of data within the register file. In this instance, context switch is implemented by controlling the output multiplexer of each cell to provide the selected context to the multiplexer for the array of register cells. In a particular example, a register may be a logic latch-based storage register or a static random access memory (SRAM) based storage register. The output multiplexer of each storage register cell is fed into another output multiplexer for the entire register cell array.

With advances in semiconductor fabrication technologies, integrated circuit devices, such as processors, have decreased in size, and the density and complexity of such integrated circuits has increased. This greater circuit density has made testing more difficult and costly. Design-for-testability (DFT) refers to a technique for reducing the complexity associated with design testing by including test logic and access points for accessing such test logic within an integrated circuit device. Modern integrated circuits usually incorporate a variety of design-for-test (DFT) structures to enhance their inherent testability. Typically, the DFT structures are based on a scan design or an automatic test pattern generation (ATPG) design, where scan test or ATPG test data may be provided to a test pin or where a plurality of externally accessible scan chains may be embedded into the integrated circuit. Typically, scan test design is used in conjunction with fault simulation and combinational automatic test pattern generation (ATPG) to generate manufacturing and diagnostic test patterns for production test and prototype debug processes.

To provide DFT functionality, a circuit may have a test input, which can be accessed during a test mode and which may be tied to a logic level during normal non-test operation. A multiplexer may be introduced to select between testing and non-testing modes and to provide a data pattern to an array output multiplexer.

For static latch-based register files, such register cell-based output multiplexers are often utilized to select between normal or shadow context to provide two execution data contexts, such as a normal data context (current process) and a shadow data context (second process). To add a test capacity, an additional two-to-one multiplexer may be added to register latch's input for additional scan test data. For a static random access memory (SRAM) type of register file, a dual-port memory cell may be needed to support both the normal data context and the shadow data context. Moreover, for testability, additional logic may be needed to support a memory built-in self-test (MEM BIST). Such additional logic introduces undesirable delays in the normal and shadow data contexts access time.

Accordingly, it would be advantageous to provide an improved context switch mechanism and DFT (design-for-testability) capability for latch-based register files.

SUMMARY

In a particular embodiment, a method of changing execution contexts is provided that includes receiving a context selection input. In a first clock phase, the method includes shifting data from a first latch element of a normal execution context to a second latch element and shifting shadow data from a third latch element of a shadow execution context to a fourth latch element of the shadow execution context. In a second clock phase, the method includes shifting the shadow data of the fourth latch element of the shadow execution context into the first latch element of the normal execution context and shifting the data of the second latch element of the normal execution context into the third latch element of the shadow execution context.

In another particular embodiment, a context switch mechanism of a register file is provided that includes first data context logic, second data context logic, and a feedback connection. The first data context logic includes a first input multiplexer and a first data latch pair. The first input multiplexer includes a data input and a shadow input. The first input multiplexer is responsive to a context selection input to selectively couple either the data input or the shadow input to an input of the first data latch. The first data latch pair includes a first data latch output coupled to a circuit device. The second data context logic includes a second input multiplexer, a second data latch pair. The second data context logic output is coupled to the shadow input of the first input multiplexer. The second input multiplexer includes a scan test input and a feedback input and is responsive to a mode selection input to selectively couple either the scan test input or the feedback input to an input of the second data latch. A feedback connection couples an output of the first data context logic to the feedback input of the second input multiplexer.

One particular advantage is provided in that two or more data execution contexts may be established to provide data to an associated circuit device without the need for an output multiplexer to select between the data execution contexts. By omitting the output multiplexer, design complexity is reduced, less layout area is used, and the speed/performance of a register file is increased.

Another particular advantage is that, by omitting the output multiplexer, a register file's access time from a data input to a data output is reduced.

Another particular advantage is provided in that the feedback arrangement of the normal data context and the shadow data context allows test pattern data scan in and out of normal and shadow context logics with existing logic devices.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE DRAWINGS

Figure 1:
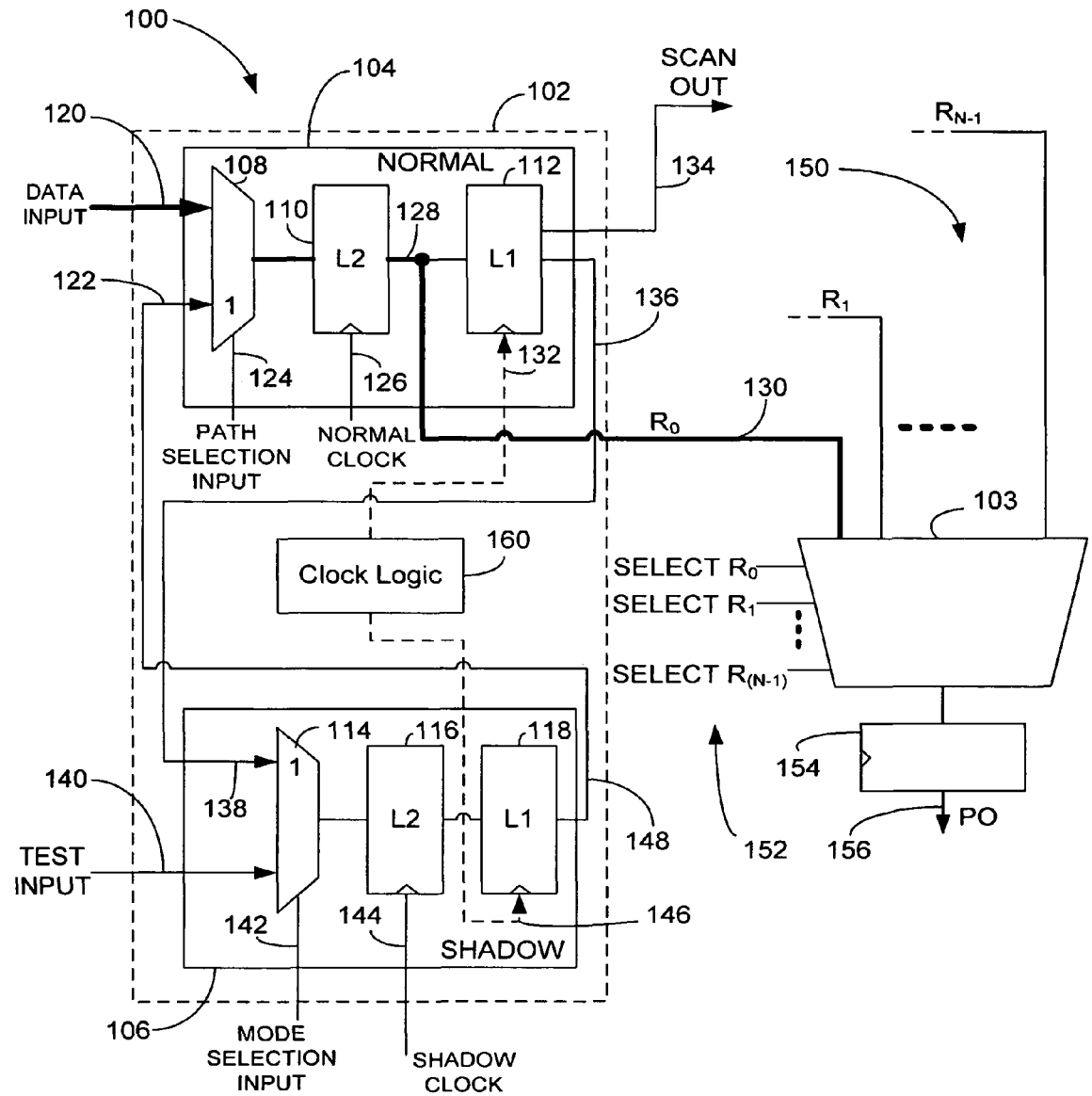
FIG. 1 is a block diagram of a particular illustrative embodiment of a context switch device of a register cell including embedded design-for-testability (DFT) functionality.

FIG. 1 is a block diagram of a particular illustrative embodiment of a system 100 including a context switch device 102 coupled to an array output multiplexer 103, which may be a many-to-one multiplexer. The context switch device 102 may be associated with a register cell of an array of register cells that define a Register File. The system 100 may serve as part of a processor, which may be a multi-threaded digital signal processor (DSP), for example. The context switch device 102 includes first data context logic, such as a normal data context 104, and second data context logic, such as a shadow data context 106. The normal data context 104 may store data associated with a first process and the shadow data context 106 may store data associated with a second process. The normal data context 104 includes a first input multiplexer 108, a first data latch 110, and a second data latch 112. The shadow data context 106 includes a second input multiplexer 114, a third data latch 116, and a fourth data latch 118. The first input multiplexer 108 includes a data input 120, a feedback input 122, a context selection input 124, and an output connected to an input of the first data latch 110. The first data latch 110 includes a normal clock input 126 and an output 128 coupled to the array output multiplexer 103 via line 130. The second data latch 112 includes an input connected to the output 128 of the first data latch 110, a clock input 132, a scan test output 134, and a feedback output 136.

The second input multiplexer 114 includes an input 138 coupled to the feedback output 136, a scan test input 140 to receive scan test data, a mode selection input 142, and an output connected to an input of the third data latch 116. The third data latch 116 includes a shadow clock input 144 and an output connected to an input of the fourth data latch 118. The fourth data latch 118 includes a clock input 146 and a shadow feedback output 148, which is coupled to the feedback input 122 of the first input multiplexer 108.

In general, the system 100 may include a plurality of register cells (not shown) that may be arranged in an array. Each register cell may include a context switch device 102 to provide one of a data context output to the input of the array output multiplexer 103. For example, the context switch device 102 may represent a context switch device of a register cell 0, and the output 130 may carry the associated output ($R_0$) to one of the inputs 150 of the array output multiplexer 103. Other register cells of the array of register cells may be coupled to respective inputs ($R_1, \ldots, R_{n-1}$) of the array output multiplexer 103. Logic (not shown) may be coupled to the array output multiplexer 103 via output selection lines 152 to select between the inputs ($R_0, R_1, \ldots, R_{N-1}$). The array output multiplexer 103 may be adapted to provide a particular input to a latch 154 and to an output 156 in response to an output selection.

The context switch device 102 is adapted to couple the data input 120 to the output 128 and to the array output multiplexer 103 in a first mode of operation, which may include a first process. The path from the data input 120 through the first input multiplexer 108 and the first input latch 110 to the output 128 and to the array output multiplexer 103 via the output line 130 may be referred to as a normal data context, a normal context execution, or a current data or execution context, and is illustrated by bold lines. The output 128 may be coupled to an input of the array output multiplexer 103. When the system 100 is switched to a shadow data context, the context switch device 102 is adapted to provide shadow data from the shadow data context 106 to the output 128 of the normal data context 104. The transition from a normal context (e.g. a current process) to the shadow context (e.g. a second process) may be referred to as a context switch or a normal-shadow swap (e.g. from the normal data context 104 to the shadow data context 106) and may be performed, without the aid of a mode selection output multiplexer, by using a two-phase normal-shadow context swapping process.

In a first clock phase of the two-phase normal-shadow context swapping process, normal data (e.g. first process data) is shifted from the first data latch 110 to the second data latch 112 and shadow data (e.g. second process data) is shifted from the third data latch 116 to the fourth data latch 118. In a second clock phase, normal data from the second data latch 112 is swapped or shifted into the third data latch 116 via the feedback output 136, the input terminal 138, and the second input multiplexer 114. The shadow data from the fourth data latch 118 is swapped (shifted) into the first data latch 110 via the shadow feedback output 148, the feedback input 122, and the first input multiplexer 108. Thus, the context switch device 102 switches between the normal data context (e.g. a first process) and a shadow data context (e.g. a second process). The array output multiplexer 103 may then be utilized to select particular rows/sets (e.g. R0, R1, . . . , R(n−1)) of register cells of the particular context.

In general, by utilizing the cross-coupled feedback arrangement between the normal data context 104 and the shadow data context 106, each register cell may provide one of two execution contexts to the array output multiplexer 103 without the need for an additional two-to-one output multiplexer to select between the data contexts. The context selection input 124 may indicate a normal context selection or a shadow context selection to control the first input multiplexer 108 to select between the normal data context 104 and the shadow data context 106. The mode selection input 142 may indicate a normal function mode or a test mode to control the second input multiplexer 114 to select between feedback data at the input terminal 138 or the scan test input 140.

To test the array output multiplexer 103 using scan test data, the mode selection input 142 is activated to couple the scan test input 140 to the third data latch 116. The mode selection input 142 may indicate a test mode selection. The context selection input 124 is activated to select the feedback input 122, and the scan test data is latched from the third data latch 116 to the fourth data latch 118 and into the first data latch 110 via the shadow feedback output 148, the feedback input 122, and the first input multiplexer 108. The scan test data may then be provided to the output 128 and to the scan test output 134 via the second data latch 112. Thus, the context switch device 102 provides three selectable contexts: a normal data context, a shadow data context, and a test data context.

In a particular embodiment, clock logic 160 may be provided to control clock signals, such as the clock signals to the normal clock input 126, to the clock input 132, to the shadow clock input 144 and to the clock input 146. In a particular embodiment, during a first clock phase of a normal-shadow context swapping process, the clock logic 160 may selectively activate or control clock signals to the normal clock input 126 of the first data latch 110 and to the clock input 132 of the second data latch 112 to selectively advance or latch data into the second data latch 112. The clock logic 160 may control clock signals to the shadow clock input 144 of the third data latch 116 and to the clock input 146 of the fourth data latch 118 to advance shadow data from the third data latch 116 into the fourth data latch 118. During a second phase of the transition, the clock logic 160 may control the clock signals to the normal clock input 126, the clock input 132, the shadow clock input 144, and the clock input 146 to shift data from the fourth data latch 118 into the first data latch 110 and from the second data latch 112 into the third data latch 116. The clock logic 160 may be included as part of the context switch device 102 or may be provided by external control logic, depending on the implementation. Thus, the context switch device 102 includes two sets of context registers in parallel, including a normal data context 104 and a shadow data context 106, and is adapted to switch contexts depending on a current process of a system, such as a digital signal processor or other processing device.

It should be understood that the terms first, second, third and fourth are illustrative and used herein to facilitate understanding. The terms are not intended to indicate any particular order of the elements.

Figure 2:
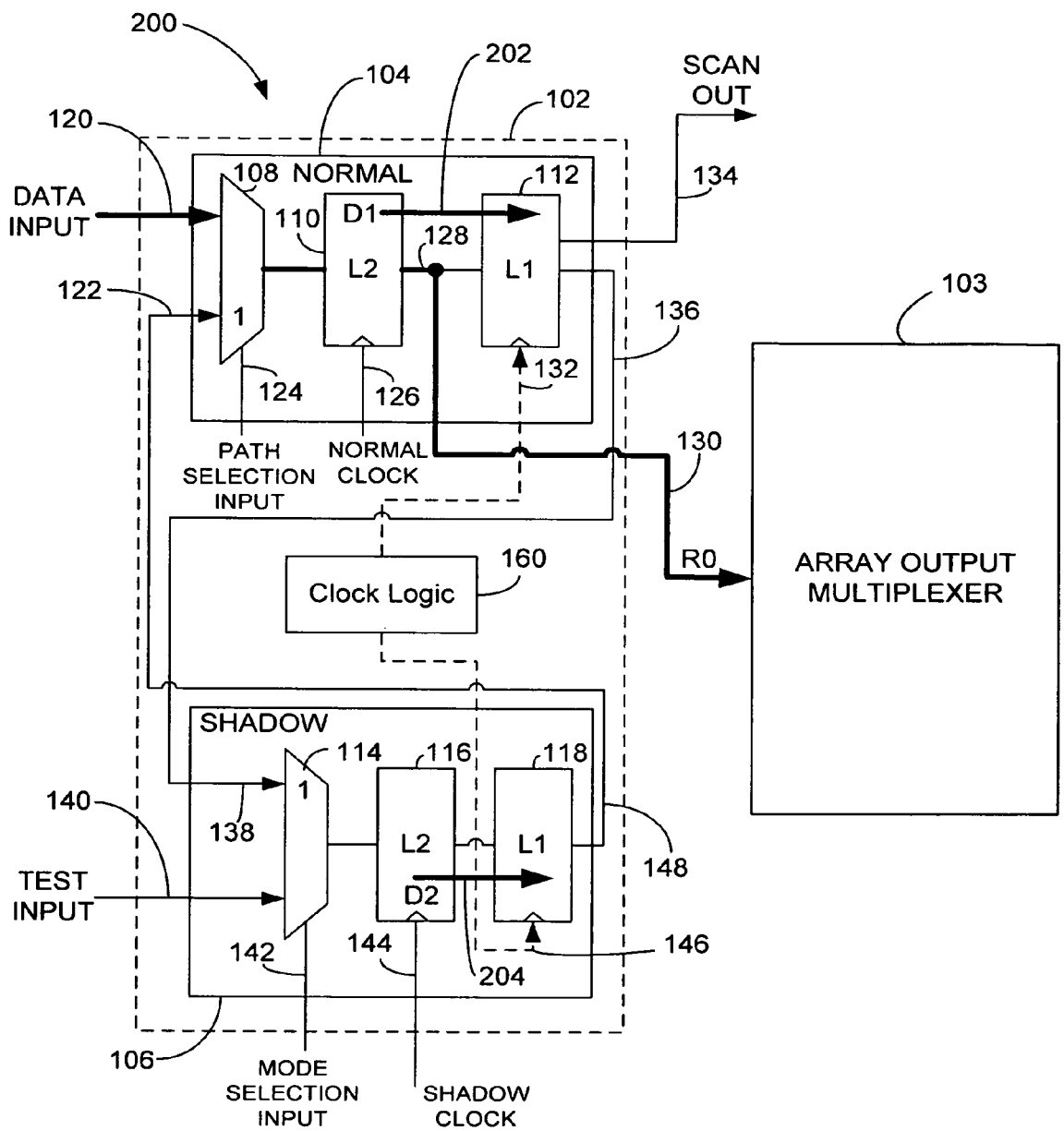
FIG. 2 is a block diagram of the context switch device of FIG. 1 illustrating a particular embodiment of a first phase of a transition from a normal data context to a shadow data context.

FIG. 2 is a block diagram of the context switch device 102 of FIG. 1 illustrating a particular embodiment during a first clock phase 200 of a transition from a normal context execution to a shadow context execution. During a normal context associated with a first process, data context received at the data input 120 is passed to the first data latch 110 via the multiplexer 108 and provided to the output 128 and to the array output multiplexer 103 via the output line 130. The data context may also be shifted into the second latch 112.

In the first clock phase 200 of the normal-shadow context swapping process, a shadow context selection is received at the context selection input 124 of the input multiplexer 108 to select the feedback input 122. The clock logic 160 may activate the second data latch 112 of the normal data context 104 to shift the data context D1 into the second data latch 112, as generally indicated by the data transition arrow 202. The clock logic 160 may activate the fourth data latch 118 of the shadow data context 106 to shift shadow data context D2 from the third data latch 116 to the fourth data latch 118, as generally indicated by data transition arrow 204.

Figures 3A, 3B:
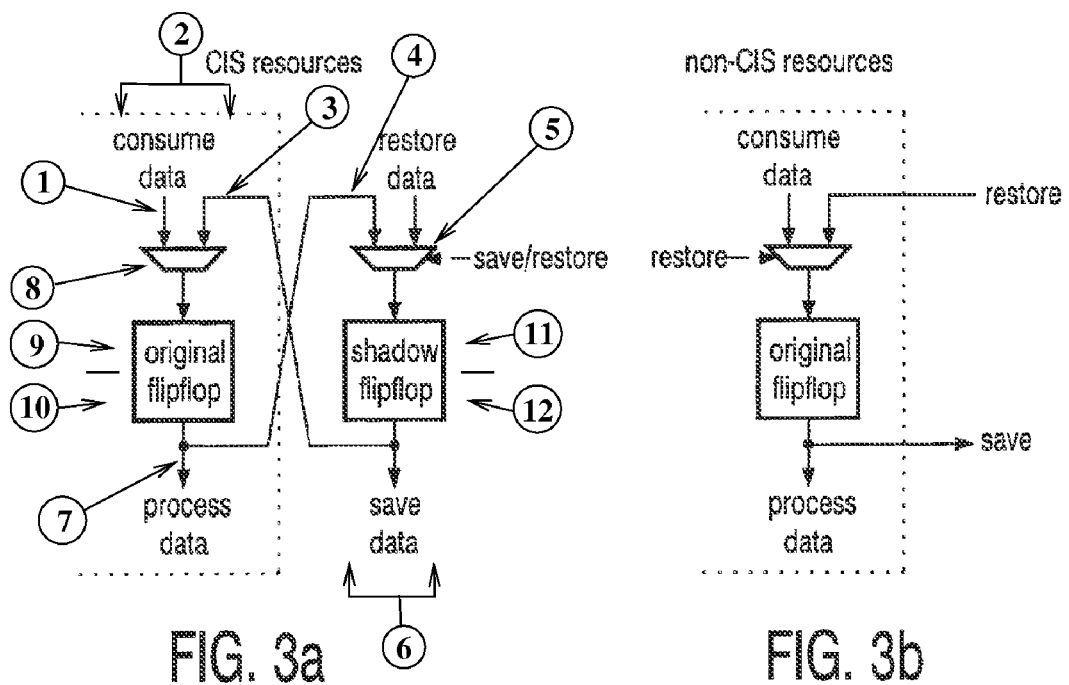
FIG. 3 is a block diagram of the context switch device of FIG. 1 illustrating a particular embodiment of a second phase of a transition from a normal data context to a shadow data context.

FIG. 3 is a block diagram of the context switch device 102 of FIG. 1 during a second clock phase 300 of the transition in which the context switch device 102 changes from the normal execution context 104 to the shadow (secondary) execution context 106. In the second clock phase 300, the normal data context 104 and the shadow data context 106 swap their respective data context. In particular, the data context D1 is shifted from the second data latch 112 of the normal data context 104 to the third data latch 116 of the shadow data context 106, as generally indicated by the data transition arrow 302. The shadow data context D2 is shifted from the fourth data latch 118 of the shadow data context 106 to the first data latch 108 of the normal data context 104, as generally indicated by the data transition arrow 304. The shadow data context D2 may then be passed by the first data latch 110 to the output 128 and to the array output multiplexer 103 via the output line 130.

It should be understood that data is swapped between the normal data context 104 and the shadow data context 106 via the feedback outputs 136 and 148. For example, the clock logic 160 may control the advance of the data context D1 from the second data latch 112 via the feedback output 136 into the second input multiplexer 114 and into the third data latch 116. Similarly, the clock logic 160 may control the clock to advance or shift the shadow data context D2 from the fourth data latch 118 via the shadow output 148 to the first input multiplexer 108 and into the first data latch 110.

By utilizing the feedback arrangement between the normal data context 104 and the shadow data context 106, the process of the shadow data context 106 may be selected and provided to the array output multiplexer 103 without using an output multiplexer. Thus, the context switch device 102 may perform execution context selection (context swapping) without the need for extra logic devices, thereby increasing speed and reducing routing and placement complexity in the chip design.

In a particular embodiment, an integrated circuit device may include the context switch device 102 and the array output multiplexer 103. In a particular embodiment, the integrated circuit device may be a digital signal processor (DSP), and the context switch device 102 may be part of a register cell of a register file of the DSP. The context switch device 102 includes a forward latch circuit, such as the normal data context 104, and a shadow latch circuit, such as the shadow data context 106. The forward latch circuit may include a first input multiplexer 108 that is responsive to a context selection input 124 to selectively couple one of a data input 120 and a shadow latch data input, such as the feedback input 122, to a forward latch circuit output, such as the output 128. The shadow latch circuit may include a second input multiplexer 114 that is responsive to a mode selection input 142 to selectively couple one of a scan test input 140 and a feedback input, such as the input 138, responsive to the forward latch circuit output. In a particular embodiment, the shadow latch data input (e.g. the feedback input 122) may include shadow data when the mode selection input 142 indicates a normal function mode selection. The shadow data may include feedback data latched into the shadow data context 106 from the forward latch circuit output (e.g. output 136). In another particular embodiment, the shadow latch input, such as the feedback input 122, includes scan test data that is delayed with respect to the scan test input 140 when the mode selection input 142 indicates a test mode selection.

In another particular embodiment, a logic device, such as the context switch device 102 may include a forward latch circuit, such as the normal data context 104, including a multiplexer 108 and at least one latch element, such as the data latch 110, and may have an output, such as the output 128. The context switch device 102 may also include a shadow latch circuit, such as the shadow data context 106. The shadow latch circuit may be coupled to the forward latch circuit to receive output data from the forward latch circuit and to latch the output data as shadow context. The multiplexer 108 may be adapted to selectively couple either data context or the shadow context to an input of the at least one latch element in response to a context selection input, such as the context selection input 124.

Figure 4:
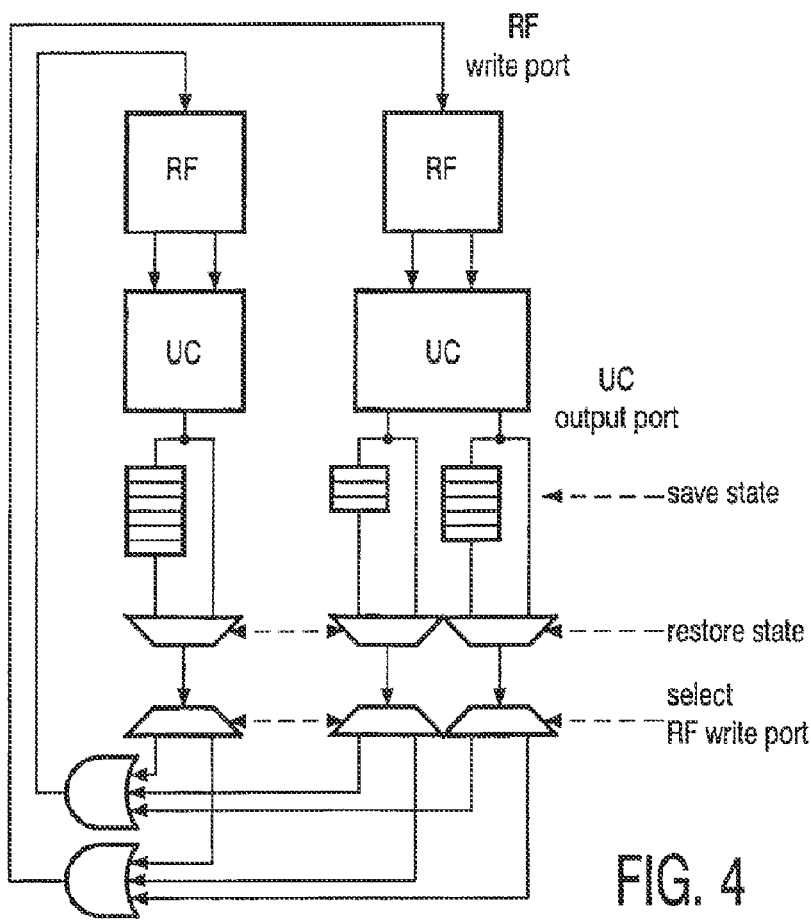
FIG. 4 is a block diagram of the context switch device of FIG. 1 illustrating a data context during a scan test operation.

FIG. 4 is a block diagram of the context switch device 102 of FIG. 1 illustrating a data context during a test operation, such as a scan test or automatic test pattern generator (ATPG) mode. To switch from a normal data context 104 to a scan test data context, the context switch device 102 may perform a multi-phase transition, similar to the context switch described with respect to FIGS. 2 and 3 above. A test mode selection is received at the mode selection input 142 of the second multiplexer 114 to select the scan test input 140. In a first clock phase, test data from the second multiplexer 114 is shifted into the third data latch 116. In a second clock phase, the test data is shifted from the third data latch 116 to the fourth data latch 118. In a third clock phase, the test data is shifted from the fourth data latch 118 to the first data latch 110 via the first multiplexer 108. In a fourth clock phase, the test data is shifted from the first data latch 110 to the test output 134 via the second data latch 112 or to the array output multiplexer 103 via the output 128 and optionally to an output of the array output multiplexer 103 (such as the output 156 of FIG. 1).

Thus, the context switch device 102 of a register cell may be adapted to selectively provide data context in a normal context, shadow context in a shadow context, or scan test data or ATPG data in a test context to the outputs 128 and 134 based on a context selection input 124 and a mode selection input 142. In a first mode (a normal context mode), data context is provided to the array output multiplexer 103 via the output 128. In a second mode (a shadow context mode), shadow data context is provided to the array output multiplexer 103 via the output 128. The shadow data context may be utilized as test pattern data. In a third mode (a test context mode), test data is provided to the output 128 and to the test output 134 via the second data latch 112. Thus, the first input multiplexer 108 may operate as a combined normal and shadow output multiplexer and an automatic test pattern generator (ATPG)/random logic built-in self-test (RLBIST) multiplexer. Using the feedback arrangement between the shadow data context 106 and the normal data context 104 and by selecting between the inputs via the first multiplexer 108 and the second multiplexer 114, the context switch device 102 provides high speed latching with DFT functionality and with reduced semiconductor chip area.

Figure 5:
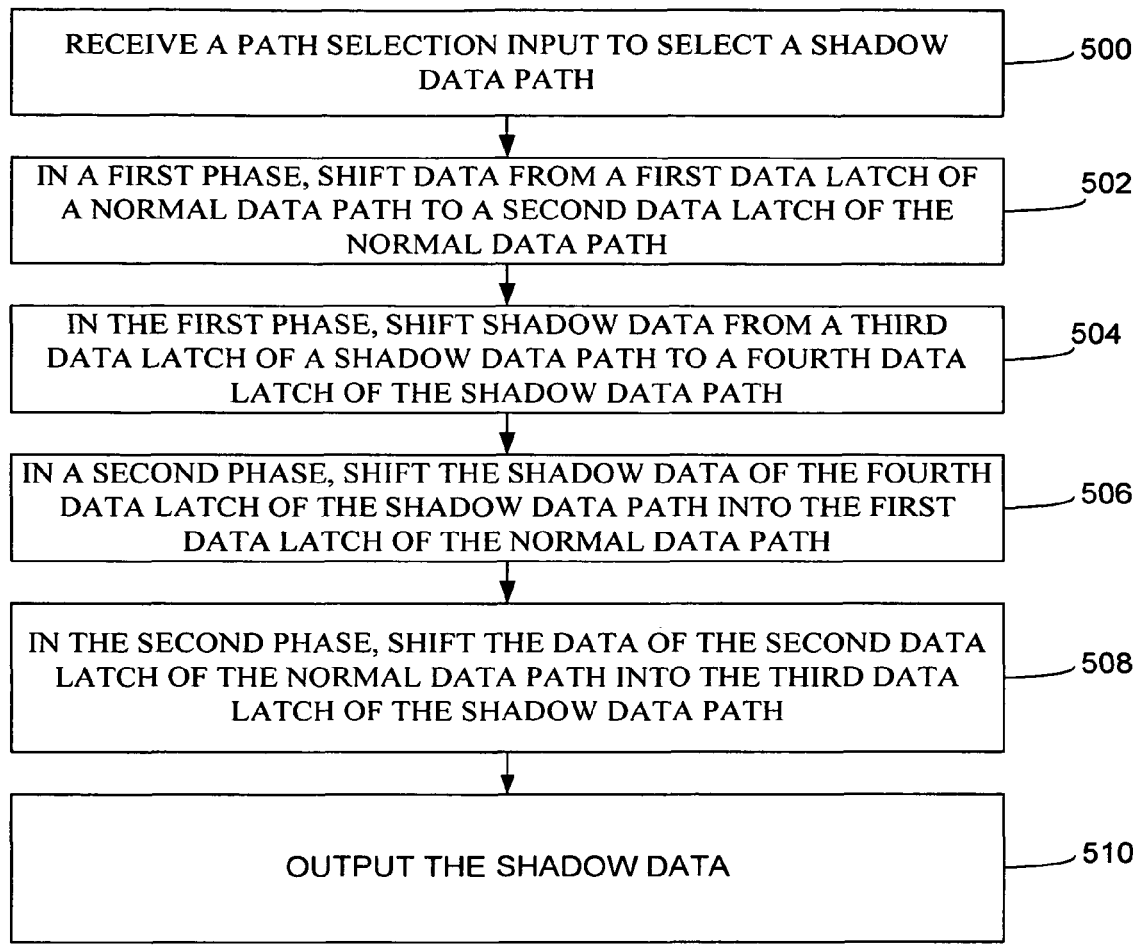
FIG. 5 is a flow diagram of a particular illustrative embodiment of a method of utilizing context switch device to select between normal context and shadow context to selectively provide one of current input data, shadow input data, or scan input data to a circuit device.

FIG. 5 is a flow diagram of a particular illustrative embodiment of a method of utilizing a context switch device of a register cell to select between normal context and shadow context. A context selection input is received to select a shadow data context (block 500). In a first phase, data is shifted from a first data latch of a normal data context to a second data latch of the normal data context (block 502). In the first phase, shadow data is shifted from a third data latch of a shadow data context to a fourth data latch of the shadow data context (block 504). In a second phase, shadow data of the fourth data latch of the shadow data context is shifted into the first data latch of the normal data context (block 506), and the data of the second data latch of the normal data context is shifted into the third data latch of the shadow execution context (block 508). The shadow data may be output (block 510) to the array output multiplexer 103, for example.

It should be appreciated by workers skilled in the art that the method of FIG. 5 describes switching between normal and shadow data contexts. However, if a test context is selected, the same switching occurs except that block 508 is not performed and the test data (either scan test data or automatic test pattern generator data) is instead shifted into the third data latch. Additionally, in the case of scan test, the test data may be output from the output of the first data latch, from a scan test output 134 of the second data latch 112, or any combination thereof.

Figure 6:
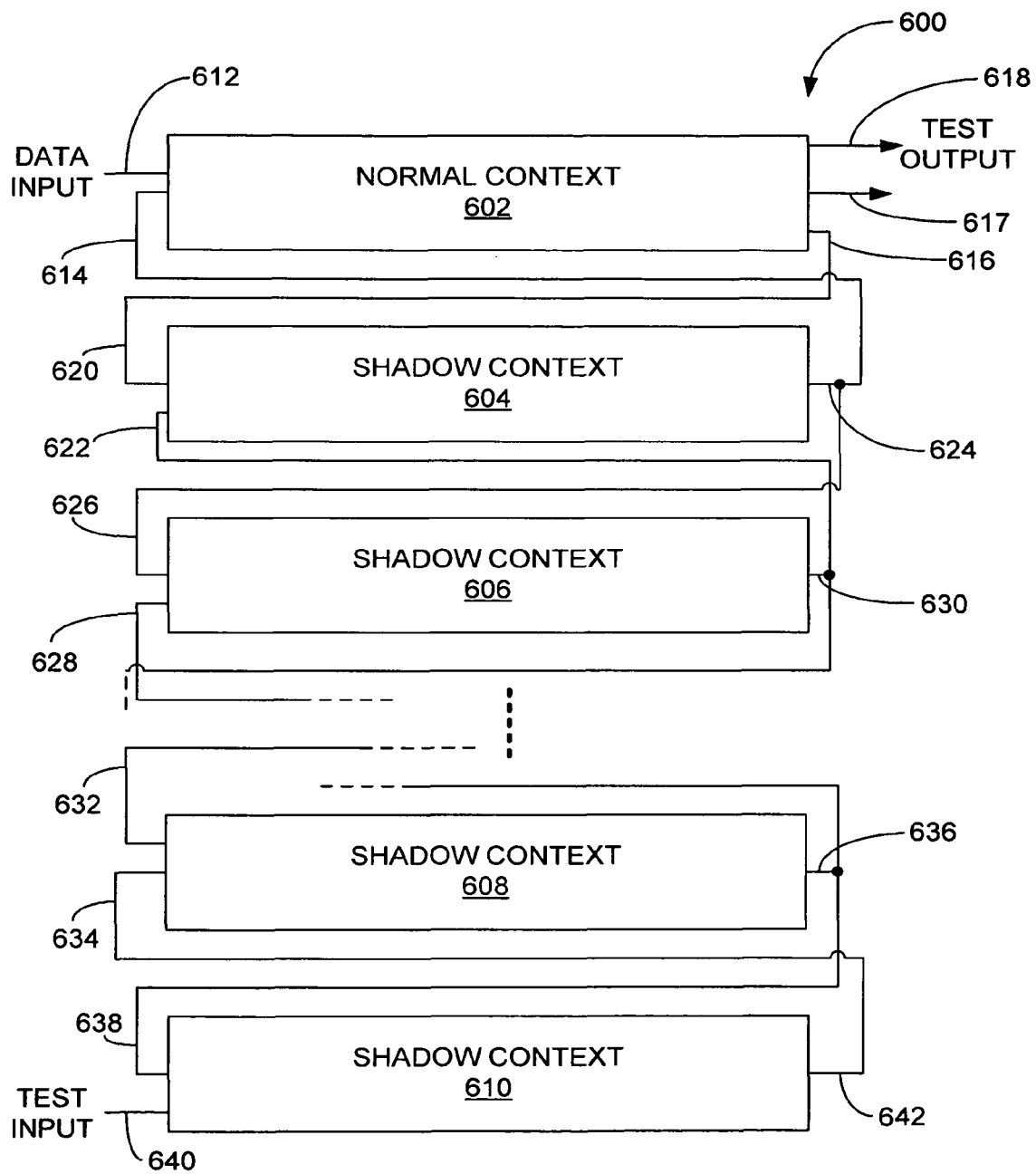
FIG. 6 is a block diagram of a particular illustrative embodiment of a context switch mechanism including multiple contexts.

FIG. 6 is a block diagram of a particular illustrative embodiment of a context switch device 600 that includes multiple contexts, which may be used in a multi-processing (multi-threading) environment. The context switch device 600 may be part of a register cell of a register array that is coupled to an array output multiplexer, such as the array output multiplexer 103 of FIG. 1. The context switch device 600 may include a normal context 602 and shadow contexts 604, 606, 608, and 610. In general, the context switch device 600 may include multiple shadow contexts in parallel with the normal context 602 to store multiple programs or processes. The normal context 602 includes a data input 612, a feedback input 614, and an output 616. The normal context 602 may also include a test output 618, which may be coupled to the output 616 or may be a separate test output as shown in FIG. 1, for example.

The shadow context 604 may include an input 620 coupled to the output 616, a feedback input 622, and an output 624 coupled to the feedback input 614 of the normal context 602. The shadow context 606 may include an input 626 coupled to the output 624, a feedback input 628, and an output 630 that is coupled to the feedback input 622 of the shadow context 604. The feedback input 628 may be coupled to another shadow context.

The shadow context 608 may include an input 632, a feedback input 634, and an output 636. The shadow context 610 may include an input 638 coupled to the output 636, a test input 640, and an output 642 coupled to the feedback input 634 of the shadow context 608. In general, the context switch device 600 may select the normal context 602 or one of the shadow contexts 604, 606, 608 and 610 and provide the selected shadow context to the output 616. In a particular embodiment, the context switch device 600 may provide the test input 640 to the output 616 (such as the feedback output 136 in FIG. 1), to the test output 618 (such as the test output 134 in FIG. 1), and to the output 617 (such as the output 128 in FIG. 1) to register array's output multiplexer (such as the array output multiplexer 103 in FIG. 1). Thus, the context switch device 600 may be used in a multi-processing environment that includes more than two processes or programs.

Figure 7:
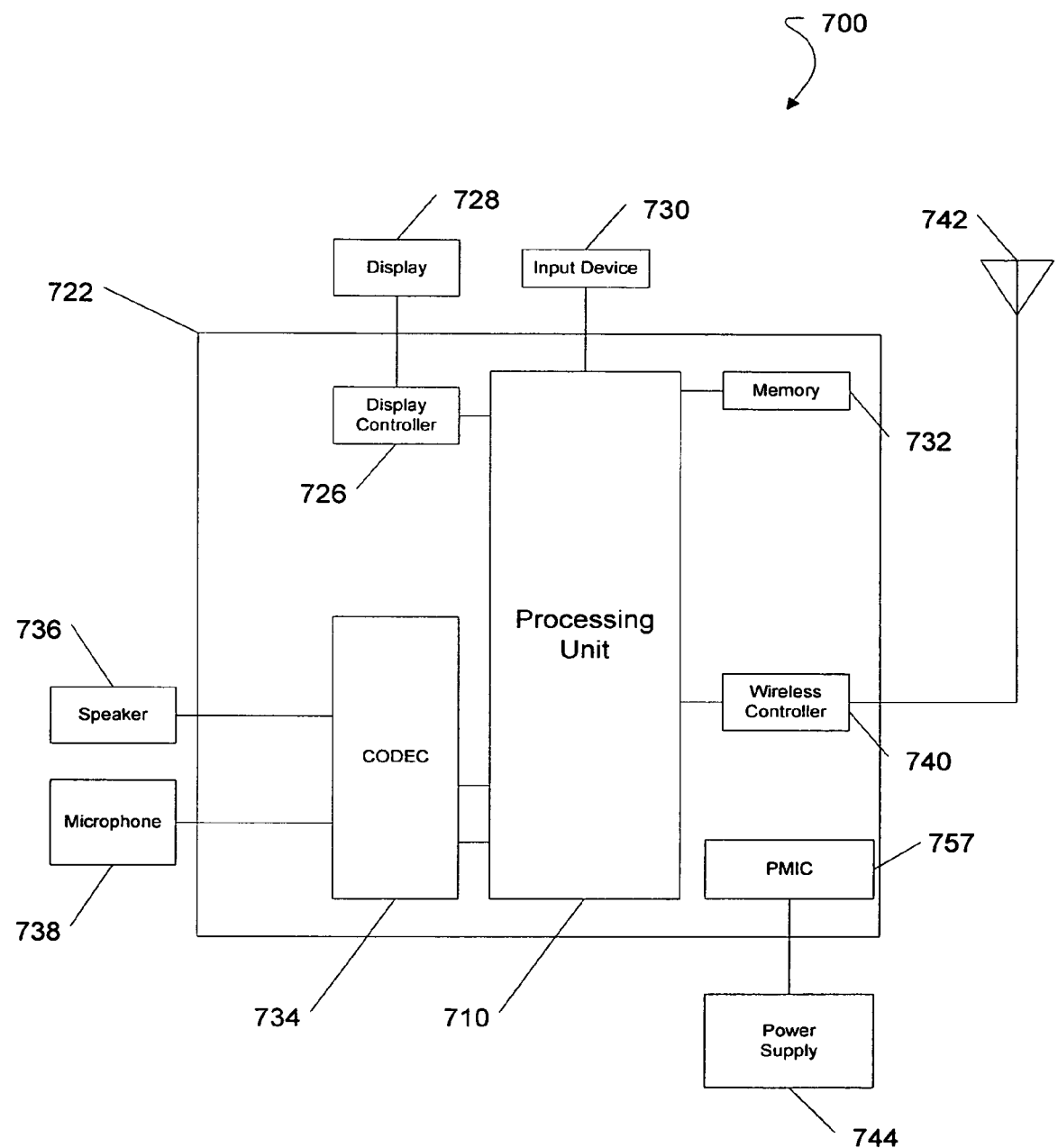
FIG. 7 is a general diagram of an exemplary portable communications device including a processor, which may utilize an input register file with a context switch device, such as that described with respect to the systems and methods of FIGS. 1-6.

FIG. 7 illustrates an exemplary, non-limiting embodiment of a portable communication device that is generally designated 700. As illustrated in FIG. 7, the portable communication device includes an on-chip system 722 that includes a processing unit 710, which may be a general purpose processor, a digital signal processor, an advanced reduced instruction set machine processor, or any combination thereof. In a particular embodiment, the processing unit 710 may comprise a multi-threaded processor to support multiple execution contexts. FIG. 7 also shows a display controller 726 that is coupled to the processing unit 710 and a display 728. Moreover, an input device 730 is coupled to the processing unit 710. As shown, a memory 732 is coupled to the processing unit 710. Additionally, a coder/decoder (CODEC) 734 can be coupled to the processing unit 710. A speaker 736 and a microphone 738 can be coupled to the CODEC 730. In a particular embodiment, the processing unit 710 may be a general purpose processor or a digital signal processor (DSP), for example, which are adapted for multi-threaded processing and which include a register array including register cells with a context switch device adapted to perform a context switch process, as shown in FIGS. 1-6 and described herein.

FIG. 7 also indicates that a wireless controller 740 can be coupled to the processing unit 710 and to a wireless antenna 742. In a particular embodiment, a power supply 744 is coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each is coupled to a component of the on-chip system 722. The on-chip system 722 may include a power management integrated circuit 757 coupled to the power supply 744 and coupled via traces (not shown) to various components of the on-chip system 722, such as the wireless controller 740, the memory 732, the processing unit 710, the CODEC 734 and the display controller 726.

In a particular embodiment, the processing unit 710 may process instructions associated with programs necessary to perform the functionality and operations needed by the various components of the portable communication device 700. For example, when a wireless communication session is established via the wireless antenna a user can speak into the microphone 738. Electronic signals representing the user's voice can be sent to the CODEC 734 to be encoded. The processing unit 710 can perform data processing for the CODEC 734 to encode the electronic signals from the microphone 738. Further, incoming signals received via the wireless antenna 742 can be sent to the CODEC 734 by the wireless controller 740 to be decoded and sent to the speaker 736. The processing unit 710 can also perform the data processing for the CODEC 734 when decoding a signal received via the wireless antenna 742.

Further, before, during, or after the wireless communication session, the processing unit 710 can process inputs that are received from the input device 730. For example, during the wireless communication session, a user may use the input device 730 and the display 728 to surf the Internet via a web browser that is embedded within the memory 732 of the portable communication device 700. Additionally, the user may utilize the input device 730 to navigate embedded menus, to navigate phone-based menus (such as automated telephone system menus), and enter telephone numbers, text-addresses, and other information.

The various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. Such storage devices may be included within portable electronic devices, including but not limited to mobile telephones. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use such disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. An integrated circuit comprising:
   a normal context circuit comprising:
   a normal context multiplexer including a first input, a second input, and an output;
   a front normal latch element including a front normal latch output, the front normal latch element operatively coupled to the output of the normal context multiplexer; and
   a back normal latch element operative to receive first data from the front normal latch element during a first clock phase and to transmit the first data during a second clock phase;
   a shadow context circuit comprising:
   a shadow multiplexer including a first input to receive the first data from the back normal latch element, wherein the shadow multiplexer further includes an output;
   a front shadow latch element operative to receive the first data from the shadow multiplexer and to output second data; and
   a back shadow latch element operatively coupled to the second input of the normal context multiplexer and operative to receive the second data from the front shadow latch element and to provide the second data to the normal context multiplexer; and
   clock logic operative to selectively provide a first clock to the front normal latch element, a second clock to the back normal latch element, a third clock to the front shadow latch element, and a fourth clock to the back shadow latch element based on a mode of operation.

2. The integrated circuit of claim 1, wherein the normal context multiplexer includes a path selection input.

3. The integrated circuit of claim 1, wherein the back shadow latch element is operative to receive the second data from the front shadow latch element during the first clock phase and to provide the second data to the normal context multiplexer during the second clock phase.

4. The integrated circuit of claim 3, wherein the front normal latch element is operative to receive the second data from the normal context multiplexer.

5. The integrated circuit of claim 1, wherein the normal context multiplexer is operative to receive a shadow output from the back shadow latch element at the second input.

6. The integrated circuit of claim 1, wherein the mode of operation is one of a plurality of modes of operation that include:
  a first mode, wherein the clock logic is operative to provide only the first clock to the front normal latch element, wherein the first data is input via the first input at the normal context multiplexer and the first data is output via an output node connected to the front normal latch element and to the back normal latch element;
  a second mode, wherein the clock logic is operative to selectively provide the second clock to the back normal latch element and the fourth clock to the back shadow latch element during the first clock phase, wherein the clock logic is operative to selectively provide the first clock to the front normal latch element and the third clock to the front shadow latch element during the second clock phase, wherein the second data is output via the output node of the front normal latch element during the second clock phase; and
  a third mode, wherein the clock logic is operative to selectively provide the third clock to the front shadow latch element during a first test clock phase, wherein the clock logic is operative to selectively provide the fourth clock to the back shadow latch element during a second test clock phase, wherein the clock logic is operative to selectively provide the first clock to the front normal latch element during a third test clock phase, wherein the clock logic is operative to selectively provide the second clock to the back normal latch element during a fourth test clock phase, wherein the second data comprises test data that is output via a scan port of the back normal latch element during the fourth test clock phase.

7. The integrated circuit of claim 1, wherein the shadow multiplexer comprises a second input operative to receive scan test data.

8. A method of shifting data within an integrated circuit, the method comprising:
  providing first data in a first mode to an output array multiplexer from a front normal output of a front normal data latch, wherein a first clock is selectively provided by clock logic to the front normal data latch;
  shifting the first data in a second mode during a first clock phase from the front normal output of the front normal data latch of the integrated circuit to a back normal data latch of the integrated circuit and the output array multiplexer, wherein the back normal data latch and the output array multiplexer are both directly coupled to the front normal output of the front normal data latch, wherein a second clock is selectively provided by the clock logic to the back normal data latch;
  shifting second data in the second mode during the first clock phase from a front shadow data latch of the integrated circuit to a back shadow data latch of the integrated circuit, wherein the back shadow data latch is directly coupled to the front shadow data latch, wherein a fourth clock is selectively provided by the clock logic to the back shadow data latch;
  shifting the first data in the second mode from the back normal data latch of the integrated circuit to the front shadow data latch of the integrated circuit during a second clock phase, wherein the first clock is selectively provided by the clock logic to the front normal data latch; and
  shifting the second data in the second mode from the back shadow data latch of the integrated circuit to the front normal data latch of the integrated circuit during the second clock phase, wherein a third clock is selectively provided by the clock logic to the front shadow data latch.

9. The method of claim 8, further comprising outputting the second data from the front normal data latch.

10. The method of claim 8, wherein shifting the second data from the back shadow data latch of the integrated circuit to the front normal data latch of the integrated circuit further comprises:
  inputting the second data from the back shadow data latch to a feedback input of a normal multiplexer; and
  outputting the second data from the normal multiplexer to the front normal data latch.

11. The method of claim 10, further comprising selecting the feedback input of the normal multiplexer to provide input to the normal multiplexer, wherein the normal multiplexer includes a data input and the feedback input.

12. The integrated circuit of claim 1, further comprising:
  a plurality of the normal context circuits;
  a plurality of the shadow context circuits; and
  an array output multiplexer coupled to the front normal latch output of each of the front normal latch elements of the plurality of normal context circuits, the array output multiplexer operative to receive the first data from each of the front normal latch elements.

13. The method of claim 8, further comprising:
  shifting third data in a third mode during a first test clock phase to the front shadow data latch, wherein the third clock is selectively provided by the clock logic to the front shadow data latch;
  shifting the third data in the third mode during a second test clock phase from the front shadow data latch to the back shadow data latch, wherein the fourth clock is selectively provided by the clock logic to the back shadow data latch;
  shifting the third data in the third mode during a third test clock phase from the back shadow data latch to the front normal data latch, wherein the first clock is selectively provided by the clock logic to the front normal data latch; and
  shifting the third data in the third mode during a fourth test clock phase from the front normal data latch to the back normal data latch, wherein the second clock is selectively provided by the clock logic to the back normal data latch, wherein the third data comprises test data that is output via a scan port of the back normal latch during the fourth test clock phase.

* * * * *